United States Patent
Chang et al.

(10) Patent No.: US 10,872,802 B2
(45) Date of Patent: Dec. 22, 2020

(54) METHOD OF DEBONDING A CARRIER SUBSTRATE FROM A DEVICE SUBSTRATE, APPARATUS FOR PERFORMING THE SAME, AND METHOD OF SINGULATING SEMICONDUCTOR CHIPS INCLUDING THE SAME

(71) Applicant: SAMSUNG ELECTRONICS CO., LTD., Suwon-si (KR)

(72) Inventors: Gun-Ho Chang, Yongin-si (KR); Myung-Kee Chung, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 44 days.

(21) Appl. No.: 16/011,759

(22) Filed: Jun. 19, 2018

(65) Prior Publication Data

US 2019/0148207 A1    May 16, 2019

(30) Foreign Application Priority Data

Nov. 13, 2017    (KR) .......................... 10-2017-0150738

(51) Int. Cl.
    *H01L 21/683*    (2006.01)
    *H01L 21/78*    (2006.01)

(52) U.S. Cl.
    CPC ...... *H01L 21/6836* (2013.01); *H01L 21/6835* (2013.01); *H01L 21/78* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC . H01L 21/6836; H01L 21/6835; H01L 21/78; H01L 2221/68318; H01L 2221/6834; H01L 2221/68381; H01L 2221/68327
USPC ........................................................ 438/464
See application file for complete search history.

(56) References Cited

U.S. PATENT DOCUMENTS

| | | | |
|---|---|---|---|
| 6,069,931 A | 5/2000 | Miyachi et al. | |
| 7,935,622 B2 | 5/2011 | Bauer et al. | |
| 9,176,399 B2 | 11/2015 | Chung | |
| 9,252,057 B2 | 2/2016 | Chowdhury et al. | |
| 2006/0286768 A1* | 12/2006 | Arana | H01L 21/306 438/455 |
| 2007/0052112 A1* | 3/2007 | Bauer | B23K 3/0623 257/786 |
| 2016/0141260 A1* | 5/2016 | Chang | H01L 21/6835 438/613 |
| 2016/0233824 A1* | 8/2016 | Ravi | H01L 31/0488 |

(Continued)

FOREIGN PATENT DOCUMENTS

| | | |
|---|---|---|
| JP | 06-252262 A | 9/1994 |
| JP | 2003-100849 A | 4/2003 |

(Continued)

*Primary Examiner* — Mohammad M Hoque
(74) *Attorney, Agent, or Firm* — Lee IP Law, PC

(57) ABSTRACT

In a method of debonding a carrier substrate from a device substrate, an ultraviolet (UV) light may be irradiated to an adhesive tape through the carrier substrate, which may be attached to a first surface of the device substrate having a connection post using the adhesive tape, to weaken an adhesive force of the adhesive tape. An outskirt portion of the carrier substrate may be masked to concentrate the UV light on the adhesive tape.

8 Claims, 15 Drawing Sheets

(56) References Cited

U.S. PATENT DOCUMENTS

2018/0076108 A1* 3/2018 Kim .................... H01L 21/4846
2018/0233410 A1* 8/2018 James .................... H01L 21/78

FOREIGN PATENT DOCUMENTS

| JP | 2007-324245 A | 12/2007 |
| JP | 2011-003613 A | 1/2011 |
| JP | 2017-034254 A | 2/2017 |
| KR | 10-2014-0147738 A | 12/2014 |
| KR | 10-2015-0019434 A | 2/2015 |

* cited by examiner

METHOD OF DEBONDING A CARRIER SUBSTRATE FROM A DEVICE SUBSTRATE, APPARATUS FOR PERFORMING THE SAME, AND METHOD OF SINGULATING SEMICONDUCTOR CHIPS INCLUDING THE SAME

CROSS-REFERENCE TO RELATED APPLICATION

Korean Patent Application No. 2017-0150738, filed on Nov. 13, 2017 in the Korean Intellectual Property Office (KIPO), and entitled: "Method of Debonding a Carrier Substrate from a Device Substrate, Apparatus for Performing the Same, and Method of Singulating Semiconductor Chips Including the Same," is incorporated by reference herein in its entirety.

BACKGROUND

1. Field

Example embodiments relate to a method of debonding a carrier substrate from a device substrate, an apparatus for performing the same, and a method of singulating semiconductor chips including the same. More particularly, example embodiments relate to a method of debonding a carrier substrate, which supports a device substrate in forming a connection post, from the device substrate, an apparatus for performing the debonding method, and a method of singulating semiconductor chips including the debonding method.

2. Description of the Related Art

When semiconductor chips are stacked to form a semiconductor package, the stacked semiconductor chips may be electrically connected with each other via a connection post, e.g., a through-silicon via (TSV). The TSV may be formed in a device substrate in which the semiconductor chips may be formed. The TSV may be exposed by removing a rear surface of the device substrate by a grinding process.

During the grinding process, the device substrate may be supported by a carrier substrate. The carrier substrate may be attached to the device substrate using an adhesive tape. After the grinding process, the carrier substrate may be debonded from the device substrate using an ultraviolet (UV) light. The device substrate may be supported by a dicing tape during the debonding process.

When energy of the UV light irradiated to the adhesive tape is not sufficient, an adhesion force of the adhesive tape may be partially maintained. Thus, when the carrier substrate is detached from the device substrate, strong stresses may be applied to the device substrate. The stresses may damage the semiconductor chips in the device substrate.

SUMMARY

According to example embodiments, there may be provided a method of debonding a carrier substrate from a device substrate. In the method of debonding the carrier substrate from the device substrate, an ultraviolet (UV) light may be irradiated to an adhesive tape through the carrier substrate, which may be attached to a first surface of the device substrate having a connection post using the adhesive tape, to weaken an adhesive force of the adhesive tape. An outskirt portion of the carrier substrate may be masked to concentrate the UV light on the adhesive tape.

According to example embodiments, there may be provided an apparatus for debonding a carrier substrate from a device substrate. The apparatus may include a UV-irradiating unit and a UV mask. The UV-irradiating unit may be arranged over the carrier substrate attached to a first surface of the device substrate having a connection post using an adhesive tape to irradiate a UV light to the adhesive tape through the carrier substrate, thereby weakening an adhesive force of the adhesive tape. The UV mask may mask an outskirt portion of the carrier substrate may be masked to concentrate the UV light on the adhesive tape.

According to example embodiments, there may be provided a method of singulating semiconductor chips. In the method of singulating the semiconductor chips, a carrier substrate may be bonded to a first surface of a device substrate in which the semiconductor chips including connection posts may be formed using an adhesive tape. A second surface of the device substrate opposite to the first surface may be removed to expose the connection posts. A dicing tape may be attached to the second surface of the device substrate. An ultraviolet (UV) light may be irradiated to an adhesive tape through the carrier substrate to weaken an adhesive force of the adhesive tape. An outskirt portion of the carrier substrate may be masked to concentrate the UV light on the adhesive tape. The carrier substrate may be detached from the device substrate. The device substrate supported by the dicing tape may be cut along a scribe lane.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Apparatus for Debonding a Carrier Substrate from a Device Substrate

Figure 1:
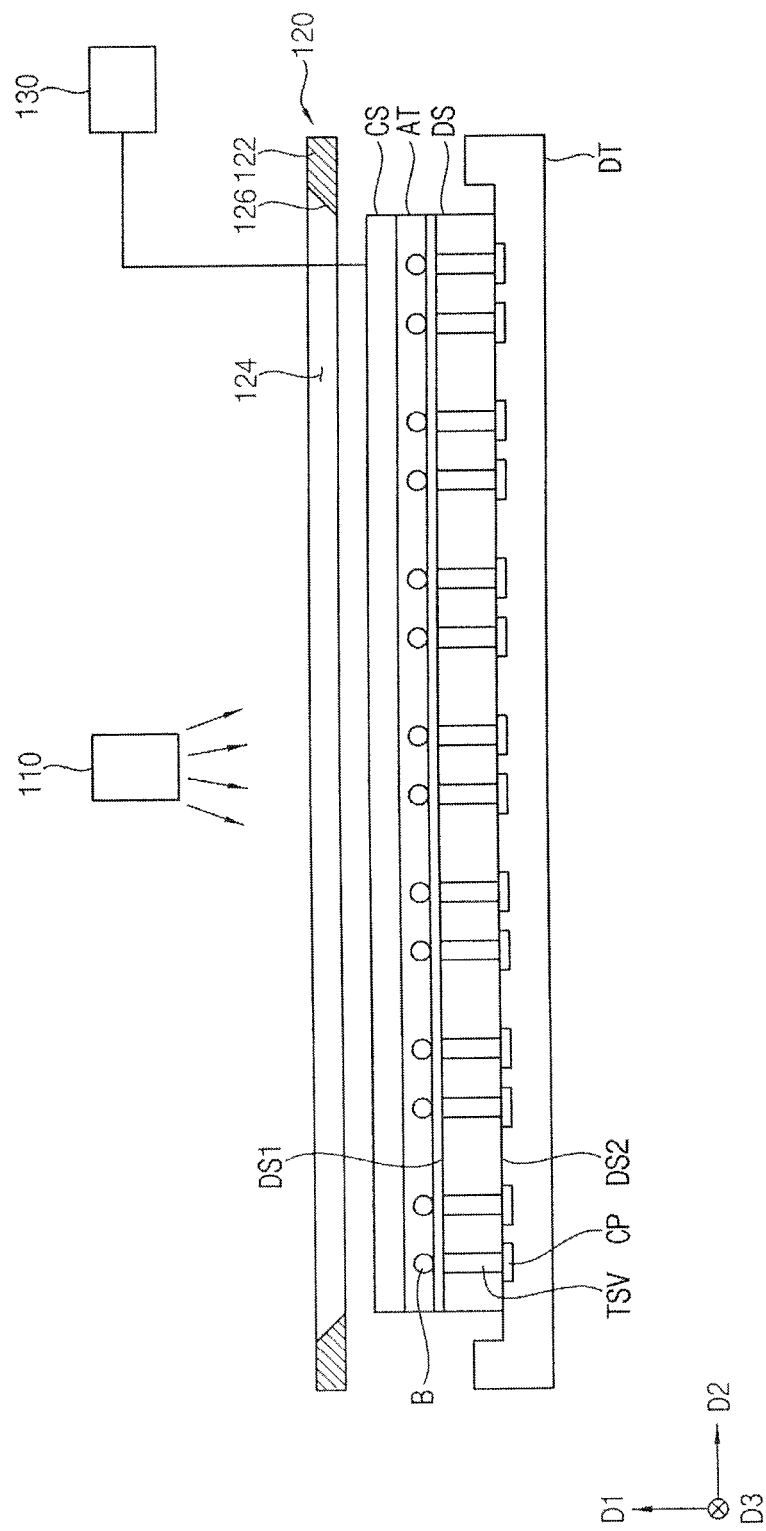
FIG. 1 illustrates a cross-sectional view of an apparatus for debonding a carrier substrate from a device substrate in accordance with example embodiments.
Figure 2:
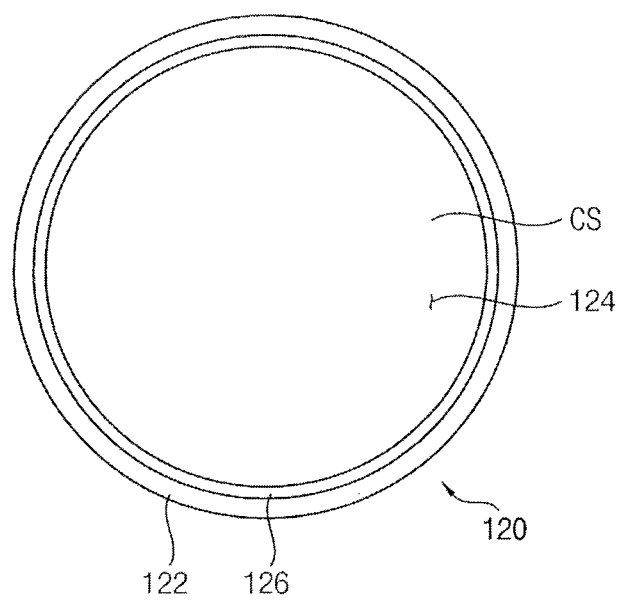
FIG. 2 illustrates a plan view of a UV mask of the apparatus in FIG. 1.

FIG. 1 is a cross-sectional view illustrating an apparatus for debonding a carrier substrate from a device substrate in accordance with example embodiments, and FIG. 2 is a plan view illustrating a UV mask of the apparatus in FIG. 1. Referring to FIGS. 1 and 2, an apparatus for debonding a carrier substrate CS from a device substrate DS in accordance with example embodiment may be configured to debond the carrier substrate CS from the device substrate DS.

The device substrate DS may have a first surface DS1 and a second surface DS2 opposite to the first surface DS1 and spaced apart therefrom along a first direction D1. In FIG. 1, the first surface DS1 may correspond to an upper surface of the device substrate DS. The second surface DS2 may correspond to a lower surface of the device substrate DS.

The device substrate DS may include a plurality of semiconductor chips. In order to stack the semiconductor chips using conductive bumps B, the device substrate DS may include a plurality of connection posts, e.g., through-silicon vias (TSVs). The connection posts TSV may be vertically arranged in the device substrate DS, e.g., may extend along the first direction D1. That is, each of the semiconductor chips stacked in the first direction D1 may include the connection posts TSV connected with pads of the semiconductor chips.

In order to provide the device substrate DS with a thin thickness along the first direction D1, the connection posts TSV may have a thickness less than a thickness of an initial device substrate. Particularly, each of the connection posts TSV may have an upper end exposed through a first surface of the initial device substrate, e.g. the first surface DS1, and a lower end positioned higher than a second surface of the initial device substrate, e.g., such that the lower end is not exposed but is covered by the initial device substrate. That is, the lower end of each of the connection posts TSV may not be exposed through the second surface of the initial device substrate.

The second surface of the initial device substrate may be removed by a removal process, e.g., a grinding process, to form the device substrate DS having the lower ends of the connection posts TSV exposed through the second surface DS2. Because the second surface of the initial device substrate may be partially removed, the device substrate DS may have a thickness less than that of the initial device substrate. Contact pads CP may be provided on the exposed lower ends of the connection posts TSV.

In performing the removal, the carrier substrate CS may support the device substrate DS. The carrier substrate CS may have a size, along the second and third directions D2 and D3, orthogonal to the first direction D1, substantially the same as that of the device substrate DS. Thus, side surfaces of the carrier substrate CS and the device substrate DS may be coplanar with each other along the first direction D1.

The carrier substrate CS may be attached to the first surface DS1 of the device substrate DS, e.g., using an adhesive tape AT. The adhesive tape AT may have an adhesion force weakened by exposure to UV light. For example, the adhesive tape AT may include a material foamed by the UV light. Foamable protrusions (see FIG. 14) may be formed on an upper surface of the adhesive tape AT making contact with the carrier substrate CS to weaken the adhesion force of the adhesive tape AT. Particularly, in order to reduce stresses applied to the device substrate DS when debonding the carrier substrate CS from the device substrate DS, UV light having high energy may be provided to the adhesive tape AT.

A dicing tape DT may be attached to the second surface DS2 of the device substrate DS. After the removal process, the dicing tape DT may be attached to the second surface DS2 of the device substrate DS. The dicing tape DT may extend beyond the device substrate in the second and third directions D2 and D3, and may extend along the first direction D1 above the second surface DS2 of the device substrate DS.

The dicing tape DT may support the device substrate DS in subsequent processes, e.g., a debonding process for the carrier substrate CS, a singulating process for dividing the device substrate DS into individual chips, etc., performed after the removal process. Thus, in order to support the device substrate DS, adhesion force of the dicing tape DT remains sufficient during the subsequent processes. However, like for the adhesive tape AT, the adhesion force of the dicing tape DT may also be weakened by exposure to UV light. For example, the dicing tape DT may include a UV curing material.

The apparatus for debonding the carrier substrate CS from the device substrate DS may include a UV-irradiating unit 110, a UV mask 120 and a vacuum-applying unit 130.

The UV-irradiating unit 110 may be arranged over the carrier substrate CS, e.g., spaced from the carrier substrate CS along the first direction D1. The UV-irradiating unit 110 may irradiate UV light onto the adhesive tape AT through the carrier substrate CS. Thus, the carrier substrate CS may include a material through which the UV may be transmitted. For example, the carrier substrate CS may include a glass.

In order to weaken the adhesion force of the adhesive tape AT to a desired level, the UV light emitted from the UV-irradiating unit 110 may be focused onto the adhesive tape AT. When the UV light having low energy is irradiated to the adhesive tape AT, strong stresses may be applied to the device substrate DS during debonding the carrier substrate CS from the device substrate DS.

The UV mask 120 may concentrate the UV light on the adhesive tape AT. The UV mask 120 may be arranged between the UV-irradiating unit 110 and the carrier substrate CS. The UV mask 120 may mask an outskirt portion, e.g., a portion external to the carrier substrate CS and not overlapping the carrier substrate CS along the first direction D1, of the carrier substrate CS to prevent the UV light from being scattered towards the outskirt portion of the carrier substrate CS. Therefore, the UV light may be focused onto the carrier substrate CS by the UV mask 120. As a result, the UV light having high energy may be irradiated to the adhesive tape AT to weaken the adhesion force of the adhesive tape AT.

The UV mask 120 may include a masking portion 122 and an opening 124. The masking portion 122 may mask the outskirt portion of the carrier substrate CS, e.g., may not overlap the device substrate along the first direction D1. That is, the masking portion 122 may mask a portion of the dicing tape DT exposed from the side surface, e.g., along the second and third directions D2 and D3, of the device substrate DS. The masking portion 122 may include a material through which the UV light may not be transmitted. The opening 124 may be vertically formed, e.g., along the first direction D1, through a central portion of the UV mask 120. The UV light may be focused on to the adhesive tape AT through the opening 124.

The UV mask 120 may further include a guiding portion 126 to guide the UV light into the opening 124. The guiding portion 126 may be formed at an angle, e.g., an acute angle relative to the first direction D1, on an inner surface of the masking portion 122. The guiding portion 126 may have a width along the second direction that gradually increases along the first direction D1, e.g., a width of the masking portion 122 along the second direction D2 may gradually decrease along the first direction D1 away from the carrier substrate CS.

In example embodiments, when the carrier substrate CS has a circular shape, the masking portion 122 may have an annular shape to overlap the outskirt portion along the first direction D1 and surround the outskirt portion of the circular carrier substrate CS. Further, the opening 124 may have a circular shape having an area in the D2-D3 plane substantially the same as that of the circular carrier substrate CS, e.g., at a surface of the UV mask 120 closest to the carrier substrate CS.

The vacuum-applying unit 130 may apply vacuum to the carrier substrate CS, which may be attached to the adhesive tape AT having the low adhesion force by the UV light, to detach the carrier substrate CS from the device substrate DS. The vacuum-applying unit 130 may include at least one suction pad to supply the vacuum to the carrier substrate CS. The suction pad may be selectively attached to the upper surface of the carrier substrate CS.

Figure 3:
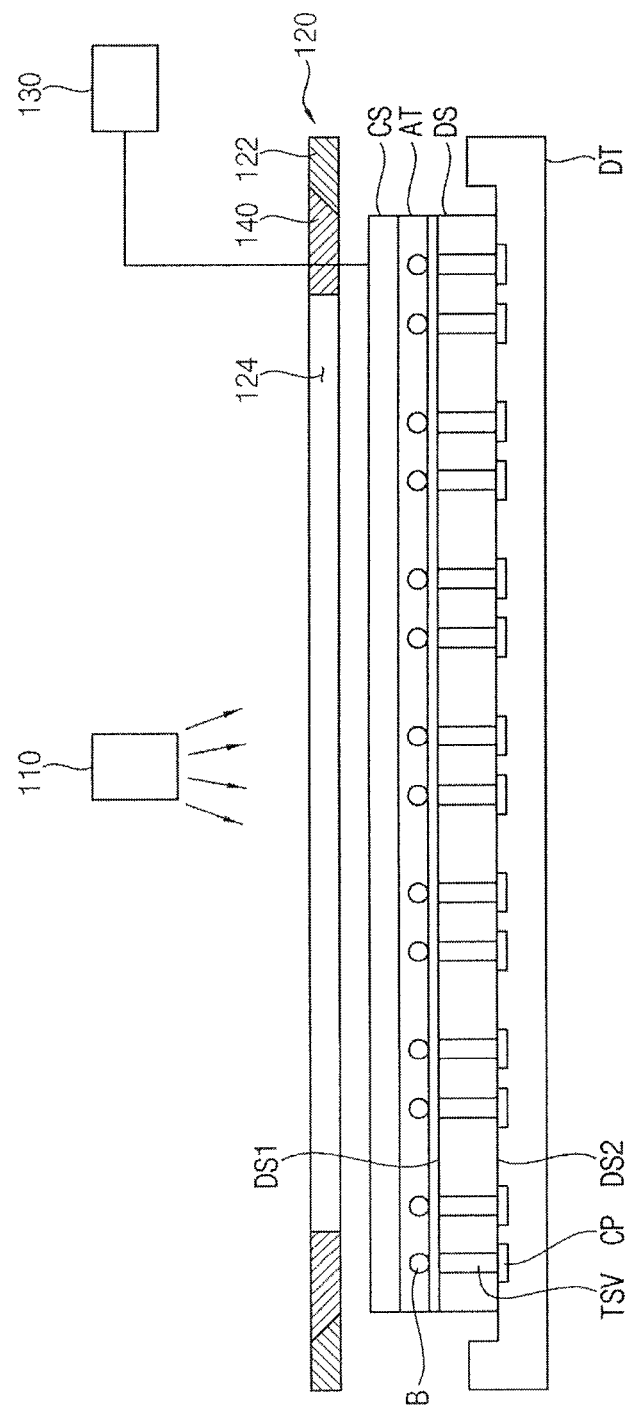
FIG. 3 illustrates a cross-sectional view of an apparatus for debonding a carrier substrate from a device substrate in accordance with example embodiments.
Figure 4:
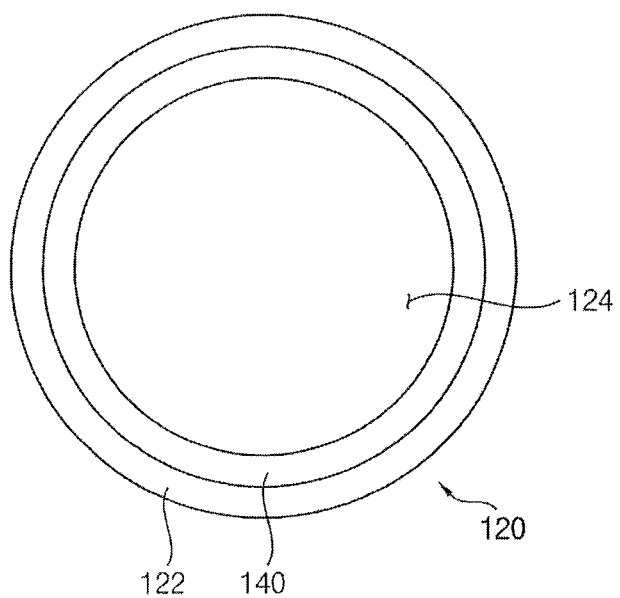
FIG. 4 illustrates a plan view of a UV mask of the apparatus in FIG. 3.

FIG. 3 illustrates a cross-sectional view of an apparatus for debonding a carrier substrate from a device substrate in accordance with example embodiments. FIG. 4 is a plan view illustrating a UV mask of the apparatus in FIG. 3.

A debonding apparatus of this example embodiment may include elements substantially the same as those of the debonding apparatus in FIG. 1 except for including a second UV mask 140. Thus, the same reference numerals may refer to the same elements and any further illustrations with respect to the same elements may be omitted herein for brevity.

Referring to FIGS. 3 and 4, the second UV mask 140 may mask an edge or peripheral portion of the carrier substrate CS. The second UV mask 140 may mask an edge portion of the adhesive tape AT, an edge portion of the device substrate DS, and a portion of the dicing tape DT under the edge portion of the device substrate DS. Thus, UV light incident on the edge portion of the adhesive tape AT, the edge portion of the device substrate DS, and the portion of the dicing tape DT under the device substrate DS may be suppressed.

The second UV mask 140 may be arranged on an inner surface of the UV mask 120. When the UV mask 120 has an annular shape, the second UV mask 140 to mask the edge portion of the carrier substrate CS may also have an annular shape, e.g., may extend from the UV mask 120 radially along the second and third directions inward. The second UV mask 140 may be integrally formed with the UV mask 120. Alternatively, the second UV mask 140 may be an element separate from the UV mask 120. Further, the second UV mask 140 may include a material substantially the same as that of the UV mask 120.

As mentioned above, the UV light emitted from the UV-irradiating unit 110 may be irradiated to the dicing tape DT as well as the adhesive tape AT. The UV light may be scattered to the outskirt portion of the carrier substrate CS. The scattered UV light may be incident to the portion of the dicing tape DT under the edge portion of the device substrate DS. Although the UV light may weaken the adhesion force of the adhesive tape AT, the scattered UV light at the outskirt portion of the carrier substrate CS may also weaken the adhesion force of the portion of the dicing tape DT under the edge portion of the device substrate DS. When the adhesion force of the dicing tape DT is weakened in the debonding process, the semiconductor chip on the edge portion of the device substrate DS may be detached from the dicing tape DT in a subsequent process. The detached semiconductor chip may interfere with other semiconductor chips to generate failures, e.g., cracks, scratches, etc.

The second UV mask 140 may mask the edge portion of the carrier substrate CS to prevent the UV light from being scattered toward the portion of the dicing tape DT under the edge portion of the device substrate DS through the edge portion of the carrier substrate CS. Thus, the adhesion force of the portion of the dicing tape DT under the edge portion of the device substrate DS may be maintained so that the semiconductor chip on the edge portion of the device substrate DS may not be detached from the dicing tape DT during a subsequent process.

Figure 5:
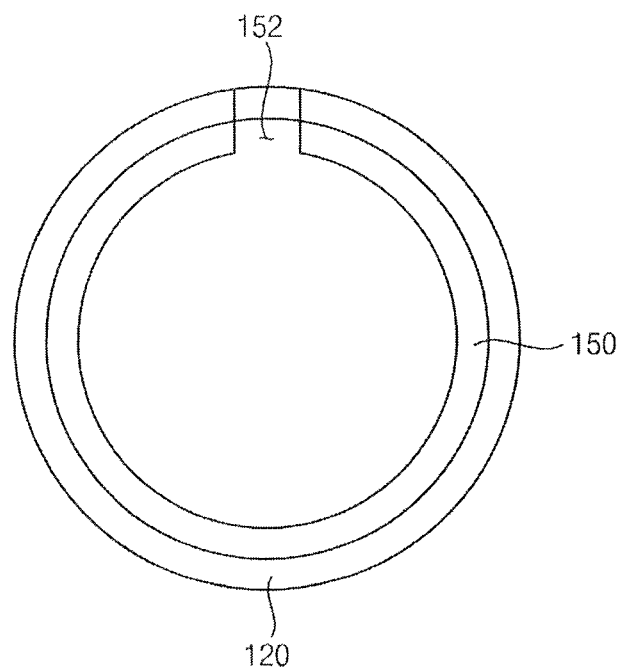
FIGS. 5 to 8 illustrate plan views of UV masks in accordance with example embodiments.

FIG. 5 is a plan view illustrating a UV mask in accordance with example embodiments. A debonding apparatus of this example embodiment may include elements substantially the same as those of the debonding apparatus in FIG. 1 except for including a second UV mask 150. Thus, the same reference numerals may refer to the same elements and any further illustrations with respect to the same elements may be omitted herein for brevity.

Referring to FIG. 5, the second UV mask 150 may have functions substantially the same as those of the second UV mask 140 in FIG. 3. Thus, any further illustrations with respect to the functions of the second UV mask 150 may be omitted herein for brevity.

The second UV mask 150 may be configured to mask the edge portion of the carrier substrate CS similarly to the second UV mask 140 in FIG. 3. Thus, energy of the UV light incident to the edge portion of the adhesive tape AT may be lower than energy of the UV light incident to a central portion of the adhesive tape AT. As a result, an adhesion force of the edge portion of the adhesive tape AT may be higher than an adhesion force of the central portion of the adhesive tape AT.

The vacuum-applying unit 130 may provide the edge portion of the carrier substrate CS with the vacuum to lift up the edge portion of the carrier substrate CS, thereby detaching the carrier substrate CS from the device substrate DS. However, when the adhesion force of the edge portion of the adhesive tape AT is higher than the adhesion force of the central portion of the adhesive tape AT, the edge portion of the carrier substrate CS may not be easily detached from the edge portion of the adhesive tape AT.

In order to prevent the above-mentioned problem, the second UV mask 150 may have an open region 152. That is, the second UV mask 150 may have an annular shape having a partially cut portion. Thus, the second UV mask 150 may partially mask the edge portion of the carrier substrate CS.

The UV light may be irradiated to the edge portion of the adhesive tape AT through the open region 152. Thus, the edge portion of the adhesive tape AT to which the UV light may be irradiated may have an adhesion force lower than that of other edge portions of the adhesive tape AT to which the UV light may not be irradiated. The suction pad may be attached to the edge portion of the carrier substrate CS corresponding to the open region 152 to readily detach the carrier substrate CS from the device substrate DS.

Figure 6:
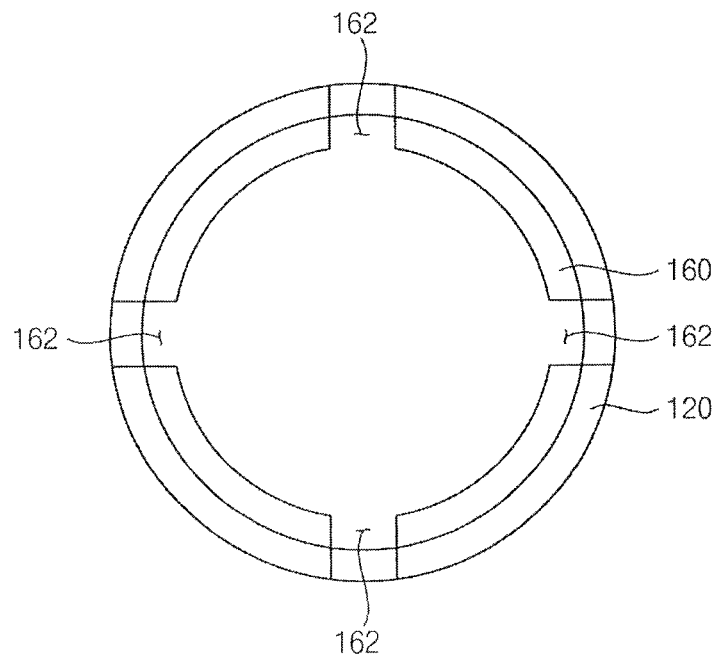

FIG. 6 is a plan view illustrating a UV mask in accordance with example embodiments. A debonding apparatus of this example embodiment may include elements substantially the same as those of the debonding apparatus in FIG. 5 except for a shape of a second UV mask 160. Thus, the same reference numerals may refer to the same elements and any further illustrations with respect to the same elements may be omitted herein for brevity.

Referring to FIG. 6, the second UV mask 160 may have functions substantially the same as those of the second UV mask 150 in FIG. 5. Thus, any further illustrations with respect to the functions of the second UV mask 160 may be omitted herein for brevity.

Most of the semiconductor chips on the edge portion of the device substrate DS may correspond to dummy chips. Distances between the dummy chips and the sides of the device substrate DS may be different from each other. Dummy chips closer to the sides of the device substrate DS may be smaller than other dummy chips farther from the side surface of the device substrate DS. The small dummy chip may be relatively easily detached from the dicing tape DT compared to the large dummy chips in a subsequent process.

The second UV mask 160 may mask the small dummy chips. Thus, the second UV mask 160 may prevent the UV light from being scattered toward portions of the dicing tape DT under the small dummy chips to maintain the adhesion force of the portions of the dicing tape DT under the small dummy chips. Therefore, the small dummy chip may not be detached from the device substrate DS in a subsequent process so that other semiconductor chips may not be damaged.

In example embodiments, the second UV mask 160 may have a quarter of annular shape having four open regions 162. The four open regions 162 may correspond to regions of the dicing tape DT from which the dummy chips may not be detached. The suction pad may be attached to the edge portion of the carrier substrate CS corresponding to at least one of the open regions 162 to readily detach the carrier substrate CS from the device substrate DS.

Figure 7:
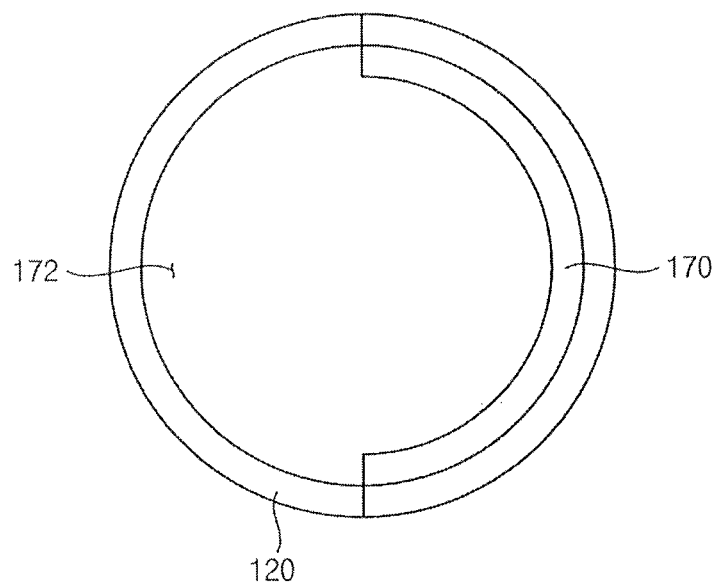

FIG. 7 is a plan view illustrating a UV mask in accordance with example embodiments. A debonding apparatus of this example embodiment may include elements substantially the same as those of the debonding apparatus in FIG. 5 except for a shape of a second UV mask 170. Thus, the same reference numerals may refer to the same elements and any further illustrations with respect to the same elements may be omitted herein for brevity.

Referring to FIG. 7, the second UV mask 170 may have a half of annular shape. A region masked by the second UV mask 170 may correspond to a region from which the dummy chips may be detached. Thus, the second UV mask 170 may have a half of annular open region 172. The open region 172 may correspond to a region from which the dummy chips may not be detached. The suction pad may be attached to the edge portion of the carrier substrate CS corresponding to the open region 172 to readily detach the carrier substrate CS from the device substrate DS.

Figure 8:
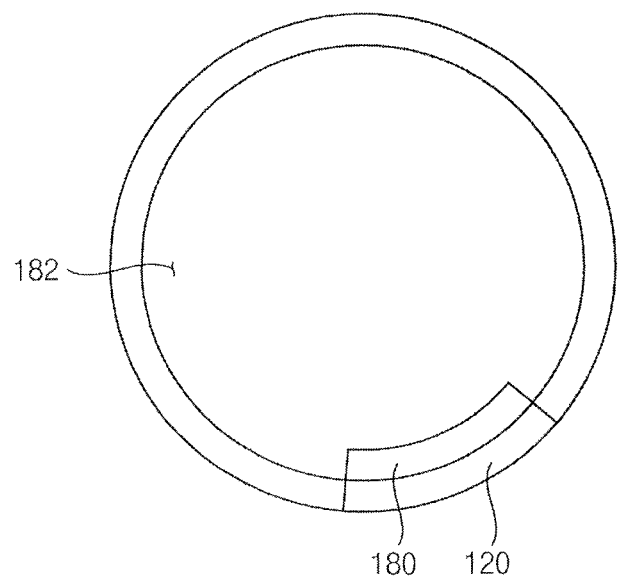

FIG. 8 is a plan view illustrating a UV mask in accordance with example embodiments. A debonding apparatus of this example embodiment may include elements substantially the same as those of the debonding apparatus in FIG. 5 except for a shape of a second UV mask 180. Thus, the same reference numerals may refer to the same elements and any further illustrations with respect to the same elements may be omitted herein for brevity.

Referring to FIG. 8, the second UV mask 180 may have a ⅛ of annular shape. A region masked by the second UV mask 180 may correspond to a region from which the dummy chips may be detached. Thus, the second UV mask 180 may have a ⅞ of annular open region 182. The open region 182 may correspond to a region from which the dummy chips may not be detached. The suction pad may be attached to the edge portion of the carrier substrate CS corresponding to the open region 182 to readily detach the carrier substrate CS from the device substrate DS.

Thus, the second UV masks described above in accordance with embodiments may partially overlap an edge portion of the carrier substrate CS along the first direction D1.

Method of Singulating Semiconductor chips

FIGS. 9 to 17 illustrate cross-sectional views of stages in a method of singulating semiconductor chips in accordance with example embodiments.

Figure 9:
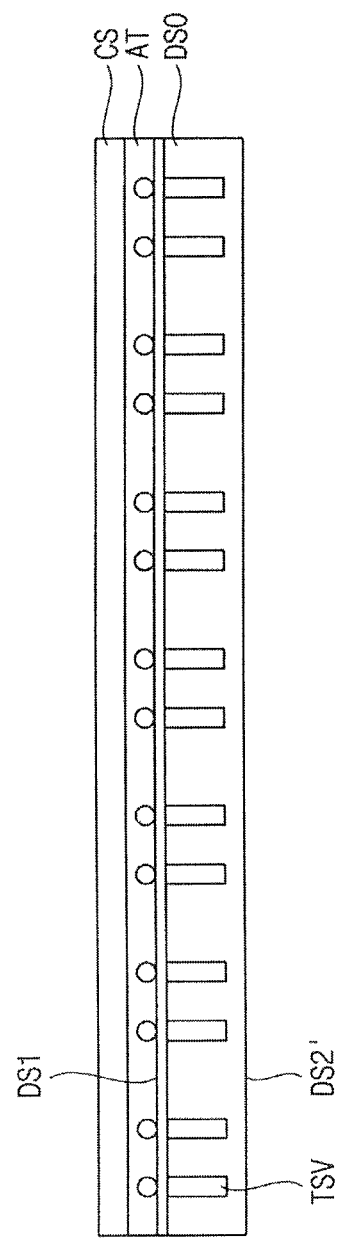
FIGS. 9 to 17 illustrate cross-sectional views of stages in a method of singulating semiconductor chips in accordance with example embodiments.

Referring to FIG. 9, the initial device substrate DS0 may have the connection posts TSV. The upper ends of the connection posts TSV may be exposed through the first surface DS1 of the initial device substrate DS0, i.e., the upper surface of the initial device substrate DS0. Bumps B may be formed on the upper ends of the connection posts TSV. In contrast, the lower ends of the connection posts TSV may be positioned higher than a second surface DS2' of the initial device substrate DS0, i.e., the lower surface of the initial device substrate DS0, such that the lower ends are not exposed by the initial device substrate DS0. The carrier substrate CS may be attached to the first surface DS1 of the initial device substrate DS0 using the adhesive tape AT.

Figure 10:
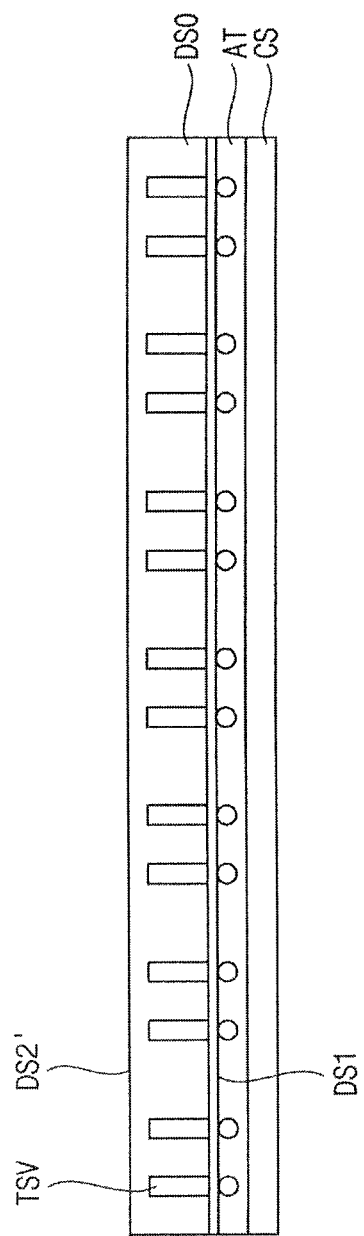

Referring to FIG. 10, the initial device substrate DS0 with the carrier substrate CS may be reversed, e.g., flipped. Thus, the carrier substrate CS may be positioned under the initial device substrate DS0. The second surface DS2' of the initial device substrate DS0 may be upwardly oriented.

Figure 11:
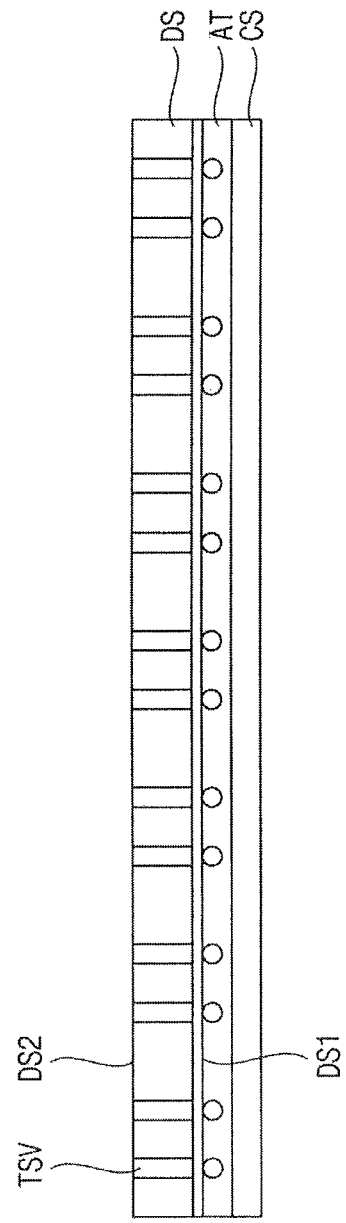

Referring to FIG. 11, the second surface DS2' of the initial device substrate DS0 may be removed to form the device substrate DS with the second surface DS2. The lower ends of the connection posts TSV may be exposed through the second surface DS2 of the device substrate DS.

Figure 12:
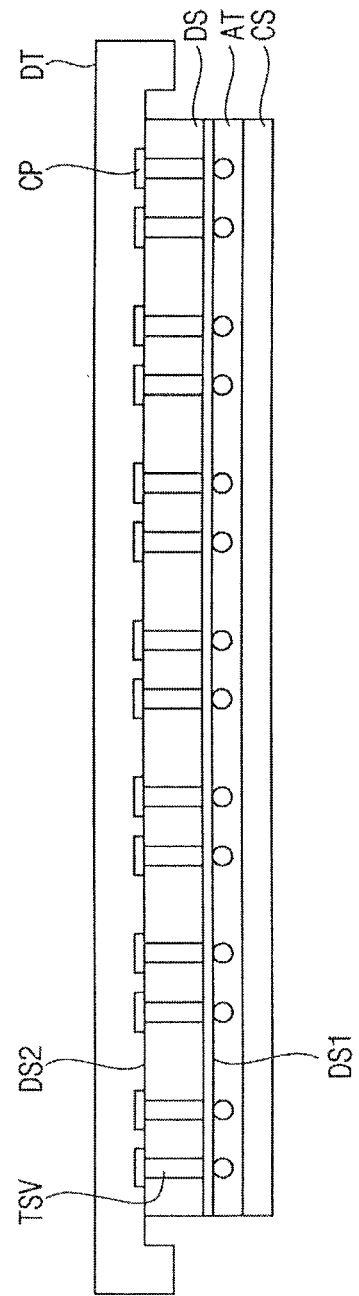

Referring to FIG. 12, after contact pads CP have been formed on the exposed lower ends of the connection posts TSV, the dicing tape DT may be attached to the second surface DS2 of the device substrate DS.

Figure 13:
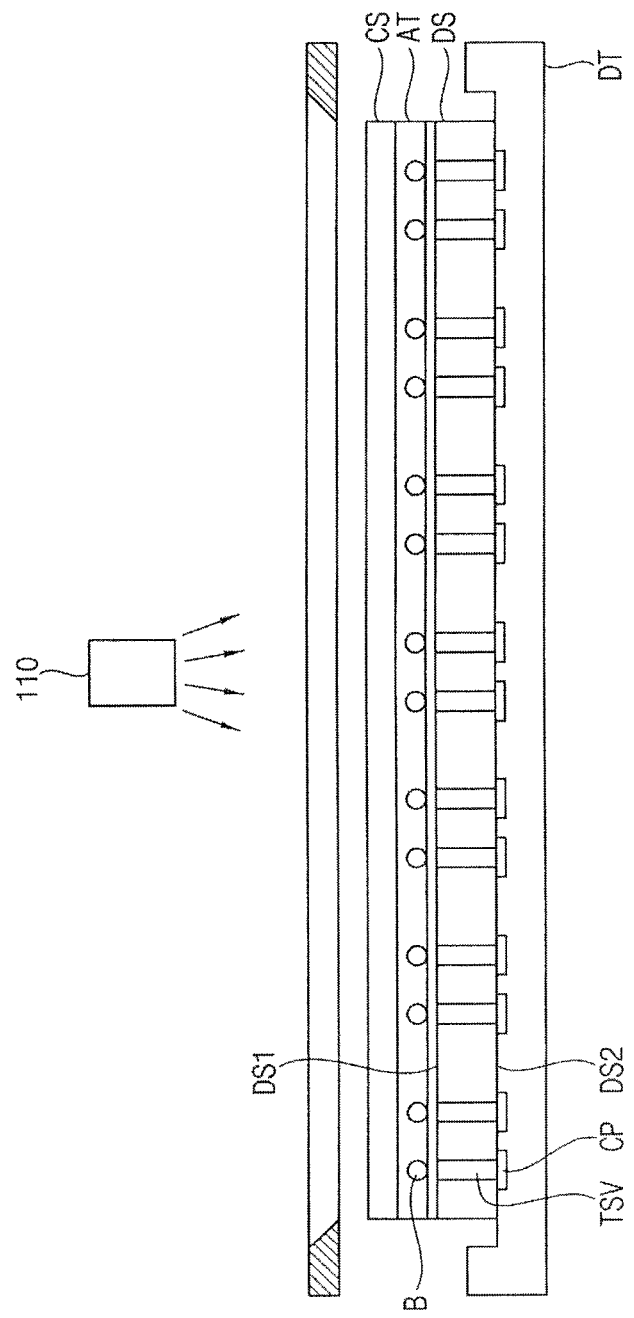

Referring to FIG. 13, the device substrate DS may then be reversed. Thus, the dicing tape DT may be downwardly oriented and the carrier substrate CS may be upwardly oriented.

The UV mask 120 may be arranged over the device substrate DS. The UV-irradiating unit 110 may irradiate the UV light to the adhesive tape AT through the carrier substrate CS. The UV light may not be transmitted through the masking portion 122 of the UV mask 120. The UV light may be focused onto the adhesive tape AT through the opening 124. Thus, the UV light having the high energy may be irradiated to the adhesive tape AT.

When the second UV mask 140 in FIG. 3 is used, the UV light may not be scattered to the edge portion of the dicing tape DT under the second UV mask 140. Thus, the adhesion force of the edge portion of the dicing tape DT under the second UV mask 140 may be maintained.

When any one of the second UV masks 150, 160, 170, and 180 in FIGS. 5 to 8 may be used, the UV light may not be scattered to the edge portion of the dicing tape DT under the second UV mask. In contrast, the UV light may be irradiated to the edge portion of the adhesive tape AT under the open region of the second UV mask. Thus, the adhesion force of the edge portion of the adhesive tape AT under the open region of the second UV mask may be weakened.

Any one of the second UV masks 150, 160, 170, and 180 may be selectively used in accordance with a region from which the dummy chip may be detached in the singulation process.

Figure 14:
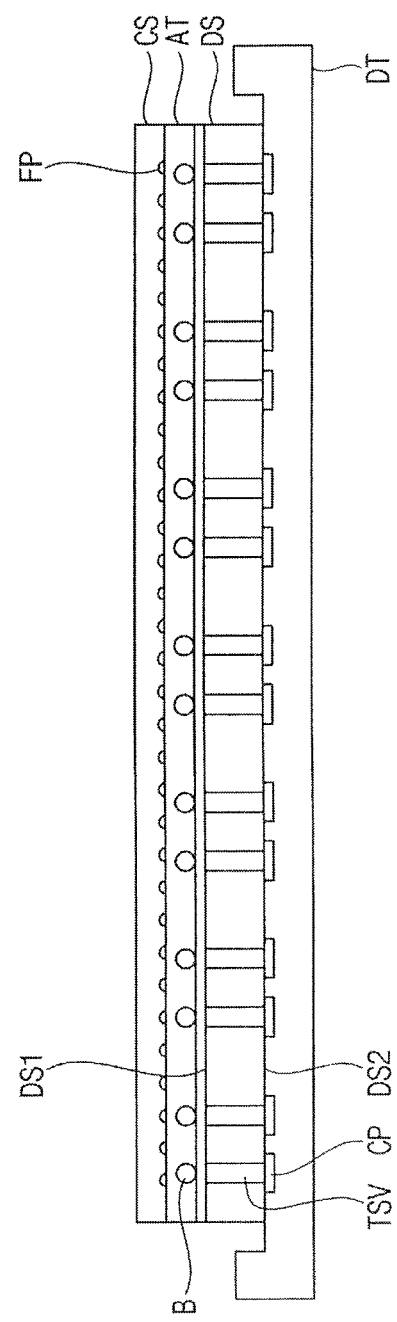

Referring to FIG. 14, when the UV light is focused onto the adhesive tape AT through the opening 124 of the UV mask 120 and the carrier substrate CS, a gas may be generated from the adhesive tape AT to form foamable protrusions FP on the upper surface of the adhesive tape AT. The carrier substrate CS may be slightly lifted up from the upper surface of the adhesive tape AT by the foamable protrusions.

Figure 15:
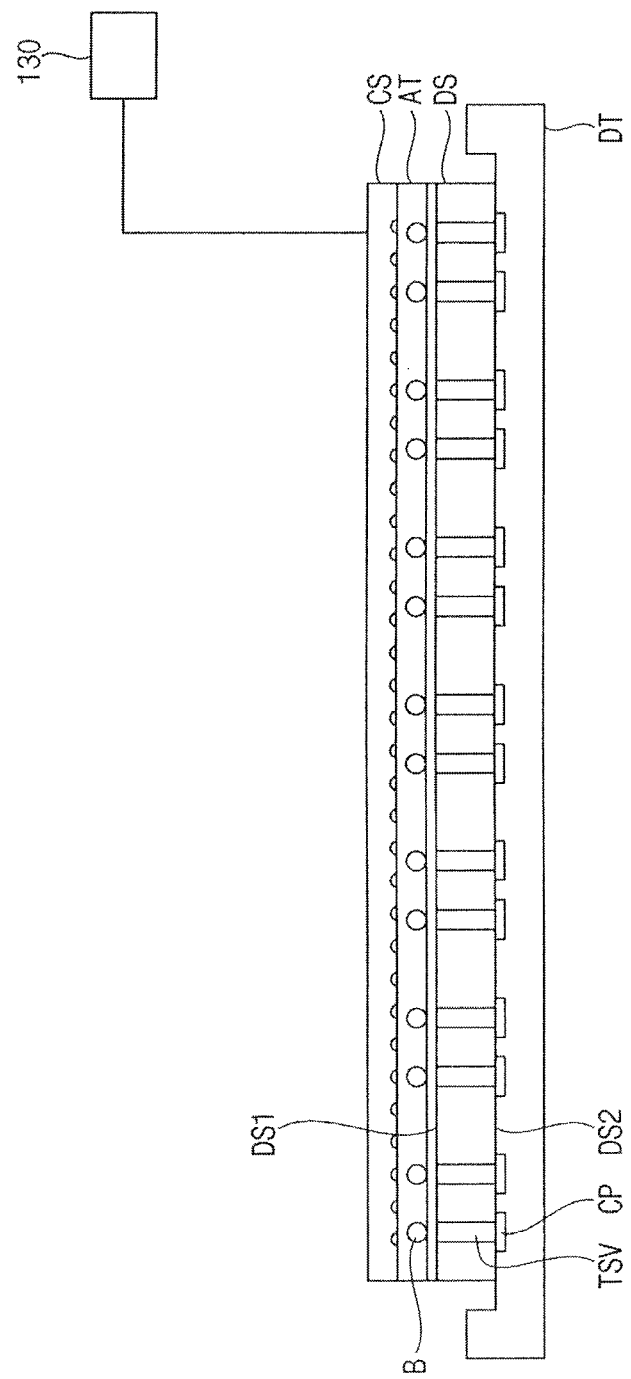

Referring to FIG. 15, the vacuum-applying unit 130 may apply a vacuum to the edge portion of the carrier substrate CS through the suction pad. When a second UV mask is used, the vacuum may be applied to the edge portion of the carrier substrate CS that was not masked by the second UV mask. Because the adhesion force of the adhesive tape AT may be weakened, the carrier substrate CS may be detached from the device substrate DS while reducing or minimizing the stresses applied to the device substrate DS.

In the debonding process, the adhesion force of the dicing tape DT may be maintained by the UV mask 120. Thus, the dicing tape DT may firmly support the device substrate DS in the debonding process.

Figure 16:
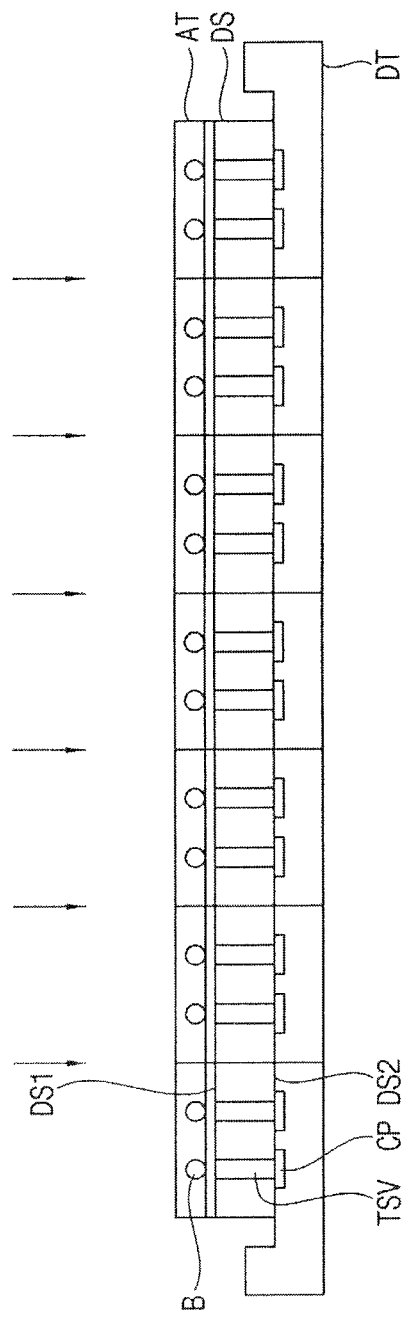

Referring to FIG. 16, the device substrate DS may be cut along scribe lanes to singulate the semiconductor chips. The adhesion force of the dicing tape DT may be still maintained by the UV mask 120 in the singulation process. Therefore, the small dummy chip may not be detached from the dicing tape DT in the singulation process. As a result, other semiconductor chips may not be damaged by a detached dummy chip.

Figure 17:
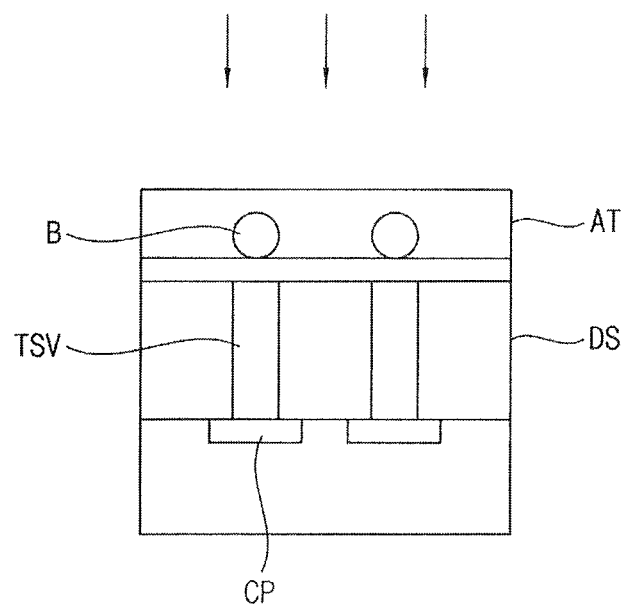

Referring to FIG. 17, the singulated semiconductor chip may be still attached to the dicing tape DT. The UV light may be irradiated to the dicing tape DT to weaken the adhesion force of the dicing tape DT. The singulated semiconductor chip may be picked-up from the dicing tape DT having the weakened adhesion force.

According to example embodiments, the UV mask may concentrate the UV light on the adhesive tape so that the adhesion force of the adhesive tape may be weakened. Thus, when the carrier substrate may be detached from the device substrate, stresses applied to the device substrate may be reduced. As a result, the semiconductor chips in the device substrate may not be damaged.

Further, a second UV mask may mask the edge portion of the carrier substrate to prevent the adhesion force of the dicing tape from being weakened. Thus, the semiconductor chip in the device substrate may not be detached from the dicing tape in the singulation process. As a result, the semiconductor chips may not be damaged by the detached semiconductor chip.

According to example embodiments, the UV mask may function as to concentrate the UV light on the adhesive tape so that the adhesion force of the adhesive tape may be weakened. Thus, when the carrier substrate may be detached from the device substrate, stresses applied to the device substrate may be reduced. As a result, the semiconductor chips in the device substrate may not be damaged.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of debonding a carrier substrate from a device substrate, the method comprising:
    providing the carrier substrate and the device substrate in a substrate assembly that includes an adhesive tape interposed between and in contact with each of the carrier substrate and a first surface of the device substrate, wherein the device substrate includes a connection post that extends toward a second surface, opposite the first surface, of the device substrate;
    irradiating ultraviolet (UV) light to the adhesive tape through a mask and the carrier substrate to weaken an adhesion force of the adhesive tape;
    masking an outskirt portion of the carrier substrate using the mask so as to concentrate the UV light on the adhesive tape; and
    masking an edge portion of the carrier substrate, which is disposed towards a center of the carrier substrate relative to the outskirt portion, using the mask so as to prevent the UV light from being scattered toward a dicing tape attached to the second surface of the device substrate,
    wherein the mask includes:
    a UV light blocking region that blocks the UV light from an entirety of the outskirt portion that surrounds the edge portion, and blocks the UV light from a first part of the edge portion, and
    a UV light transmitting region at an interior of the UV light blocking region, the UV light transmitting region extending through a partially cut portion of the UV light blocking region toward a periphery of the mask such that the partially cut portion transmits the UV light to a second part of the edge portion.

2. The method as claimed in claim 1, wherein masking the edge portion of the carrier substrate includes masking at least one semiconductor chip having a relatively small size among semiconductor chips on an edge portion of the device substrate.

3. The method as claimed in claim 1, further comprising detaching the carrier substrate from the device substrate.

4. The method as claimed in claim 3, wherein detaching the carrier substrate from the device substrate includes applying vacuum to the carrier substrate.
    wherein the vacuum-applying unit applies the vacuum to the second part of the edge portion of the carrier substrate which is not masked by the part of the outermost periphery of the second UV mask.

5. A method of singulating semiconductor chips, the method comprising:
    bonding a carrier substrate to a first surface of a device substrate using adhesive tape, the device substrate including semiconductor chips having connection posts;
    removing a second surface of the device substrate opposite to the first surface to expose the connection posts;
    attaching a dicing tape to the second surface of the device substrate;
    masking an outskirt portion of the carrier substrate using a mask so as to concentrate ultraviolet (UV) light onto the adhesive tape;
    masking an edge portion of the carrier substrate, which is disposed towards a center of the carrier substrate relative to the outskirt portion, using the mask so as to prevent the UV light from being scattered toward the dicing tape;
    irradiating UV light onto the adhesive tape to weaken an adhesion force of the adhesive tape;
    detaching the carrier substrate from the device substrate; and
    singulating the device substrate supported by the dicing tape,
    wherein the mask includes:

a UV light blocking region that blocks the UV light from an entirety of the outskirt portion that surrounds the edge portion, and blocks the UV light from a first part of the edge portion, and a UV light transmitting region at an interior of the UV light blocking region, the UV light transmitting region extending through a partially cut portion of the UV light blocking region toward a periphery of the mask such that the partially cut portion transmits the UV light to a second part of the edge portion.

6. The method as claimed in claim 5, wherein masking the edge portion of the carrier substrate includes masking at least one semiconductor chip having a relatively small size among semiconductor chips on an edge portion of the device substrate.

7. The method as claimed in claim 5, wherein detaching the carrier substrate from the device substrate includes applying vacuum to the carrier substrate.

8. The method as claimed in claim 5, further comprising, after singulating, further irradiating the UV light to the dicing tape before picking-up the semiconductor chips from the dicing tape.

\* \* \* \* \*